United States Patent [19]
Philbrick et al.

[11] Patent Number: 5,220,184
[45] Date of Patent: Jun. 15, 1993

[54] MULTIPLE ARRAY LINEAR CCD IMAGER

[75] Inventors: Robert H. Philbrick; Herbert J. Erhardt, both of Rochester, N.Y.

[73] Assignee: Eastman Kodak Company, Rochester, N.Y.

[21] Appl. No.: 891,346

[22] Filed: May 29, 1992

[51] Int. Cl.$^5$ .................. H01L 29/78; H01L 27/14; H04N 9/07

[52] U.S. Cl. .................. 257/234; 257/241; 257/248; 257/250; 358/44; 358/48

[58] Field of Search .................. 257/232–234, 257/241, 248, 250; 358/44, 213.13, 213.26, 213.29, 41, 43, 48

[56] References Cited
U.S. PATENT DOCUMENTS 5,105,264  4/1992  Erhardt .................. 358/43

Primary Examiner—Gene M. Munson
Attorney, Agent, or Firm—Stephen C. Kaufman

[57] ABSTRACT

An array of linear CCD image sensors comprises first, second and third CCD image sensors arranged in spaced parallel relation on a body of a semiconductor material. Each CCD image sensor comprises a row of photodetectors, a CCD shift register extending along the row of photodetectors and an output circuit at one end of the CCD shift register. All of the output circuits are at a common end of their respective CCD shift registers. Each CCD shift register includes first and second sets of gate electrodes alternating along the CCD shift register. A first bus line connects the first gate electrodes of each CCD shift register and a second bus line electrically connects the second gate electrodes of each CCD shift register. One of the bus lines of the second CCD shift register is electrically connected to a bus line of the first CCD shift register, and the other bus line of the second CCD shift register is electrically connected to a bus line of the third CCD shift register. This allows all of the bus lines to extend around the output circuits without extending the space between the image sensors.

13 Claims, 3 Drawing Sheets

MULTIPLE ARRAY LINEAR CCD IMAGER

FIELD OF THE INVENTION

The present invention relates to an array of a plurality of linear charge-coupled device (CCD) imagers, and, more particularly, to an array of three linear CCD imagers in which the metal bus connections of all the CCDs can be driven from both ends.

BACKGROUND OF THE INVENTION

Referring now to FIG. 1, there is shown a top plan view of a prior art a two phase linear CCD sensor 10, which comprises a substrate body 12 of a semiconductor material having therein a plurality of photodetectors 14 arranged in a line. A CCD shift register 16 extends along the line of photodetectors 14. The CCD shift register 16 comprises two sets of gate electrodes 18 and 20. Two gate electrodes 18 and 20, one from each set, are adjacent each photodetector 14. The gate electrodes 18 are all electrically connected together by a metal bus line 22, and the gate electrodes 20 are all electrically connected together by a separate metal bus line 24. A conductive transfer gate 26 extends over the body 12 between the photodetectors 14 and the CCD shift register 16. In the body 12 and in an area adjacent one end of the CCD shift register 16 is an output circuit 28, the details of which are not shown, to which the CCD shift register 16 is connected. The metal bus lines 22 and 24 are connected to a source of voltage (not shown) which is clocked to operate the CCD shift register 16. For long CCDs which are operated at high frequencies, it is desirable to be able to drive the gate electrodes 18 and 20 from both ends of the metal bus lines 22 and 24. For certain types of operations, it is desirable to have a multiple array CCD sensor.

Referring now to FIG. 2, there is shown a top plan view of a multiple array CCD sensor 30 of the prior art formed of three linear CCD sensors 10a, 10b and 10c. Each of the linear CCD sensors 10a, 10b and 10c is identical to the linear CCD sensor 10 shown in FIG. 1 and has bus lines 22a, 24a, 22b, 24b, and 22c and 24c, respectively. In order to minimize the size of the sensor array 30, the CCD sensors 10a, 10b and 10c are made as compact as possible and are provided on a substrate body 12 which is as small as possible. One problem with this approach is that there is not enough room for all of the metal bus lines 22a, 24a, 22b, 24b, 22c, 24c to extend to both ends of the sensor array 30. The bus line 24b for the middle CCD sensor 10b has no room to extend around the area of the output circuit 28b. The output circuits 28b and 28c could be spread out (separated) to accommodate the bus lines 22b and 24b of the middle CCD sensor 10b, but this would increase the overall width of the substrate body 12, and potentially lead to amplifier mismatches. The total capacitance of each of the output circuits 28a, 28b and 28c must be designed to be extremely small (typically less than 25 fF). Spreading out the output circuits 28b and 28c to make room for the bus lines 22b and 24b would increase the capacitance and possibly lead to channel-to-channel mismatch in gains. Therefore, it would be desirable to have an arrangement of three linear CCD image sensors on a single substrate body in which all of the bus lines can be extended to both ends of the CCD shift registers while maintaining a substrate body of as small as is reasonably possible.

SUMMARY OF THE INVENTION

The present invention is directed to an image sensor array comprising a body of semiconductor material having therein first, second and third CCD sensors. Each of the CCD sensors comprises a CCD shift register with first and second sets of gate electrodes, a first bus line electrically connecting the first set of gate electrodes and a second bus line electrically connecting the second set of gate electrodes. One of the bus lines of the second CCD sensors is electrically connected to a bus line of the first CCD image sensor, and the other bus line of the second CCD sensor is electrically connected to a bus line of the third CCD sensor.

The invention will be better understood from the following more detailed description taken with the accompanying drawings and claims.

It should be understood that the drawings are not all necessarily to scale.

DETAILED DESCRIPTION

Figure 1:
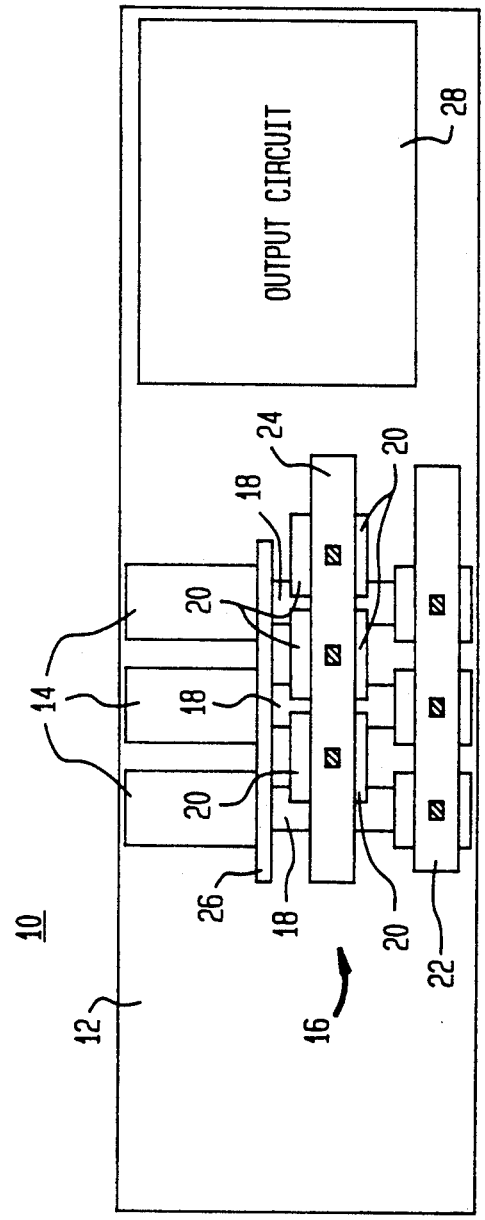
FIG. 1 is a top plan view of a prior art single linear CCD sensor.
Figure 2:
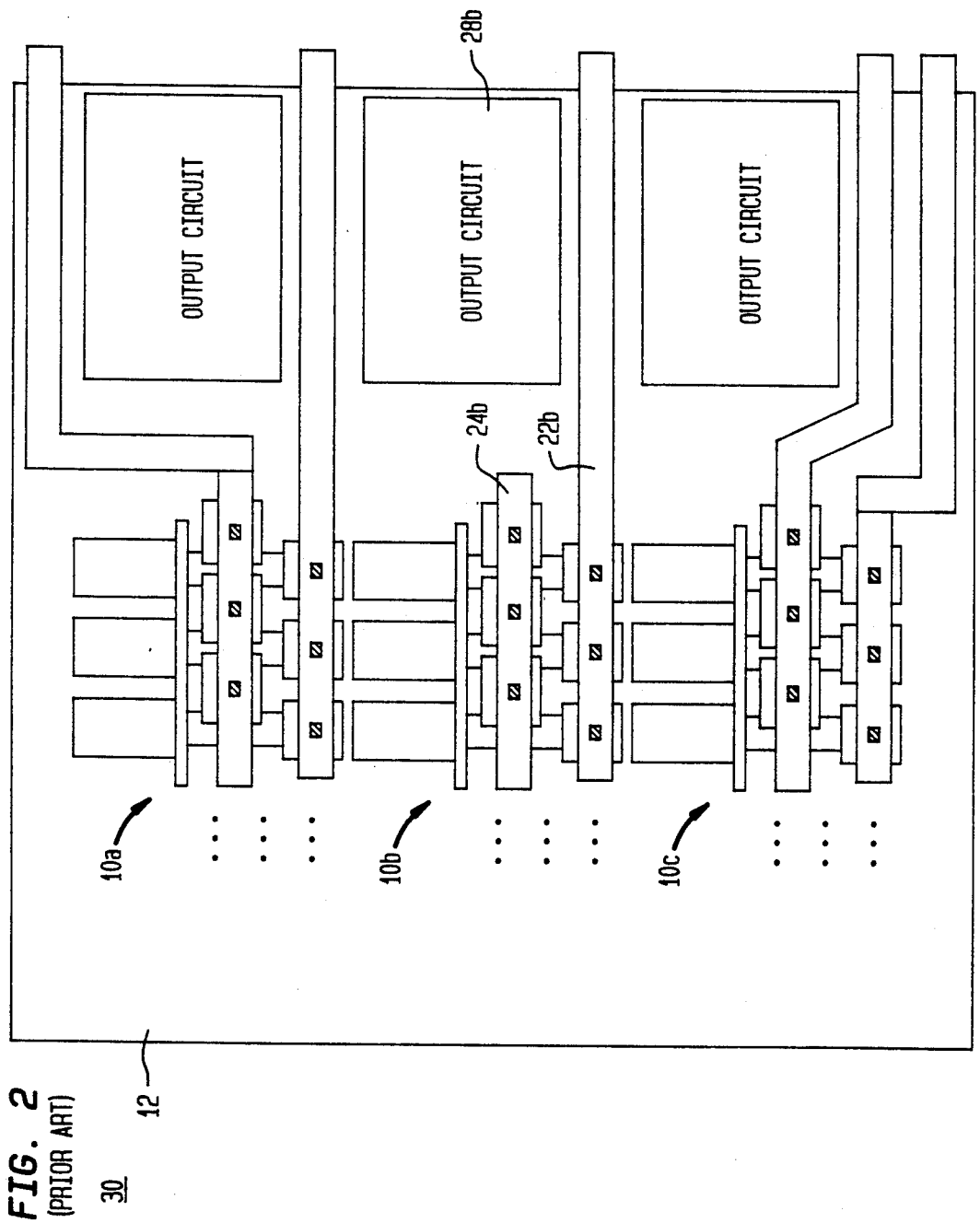
FIG. 2 is a top plan view of a prior art multiple linear CCD sensor array of the prior art having three linear CCD sensors which illustrates a problem of such an array.
Figure 3:
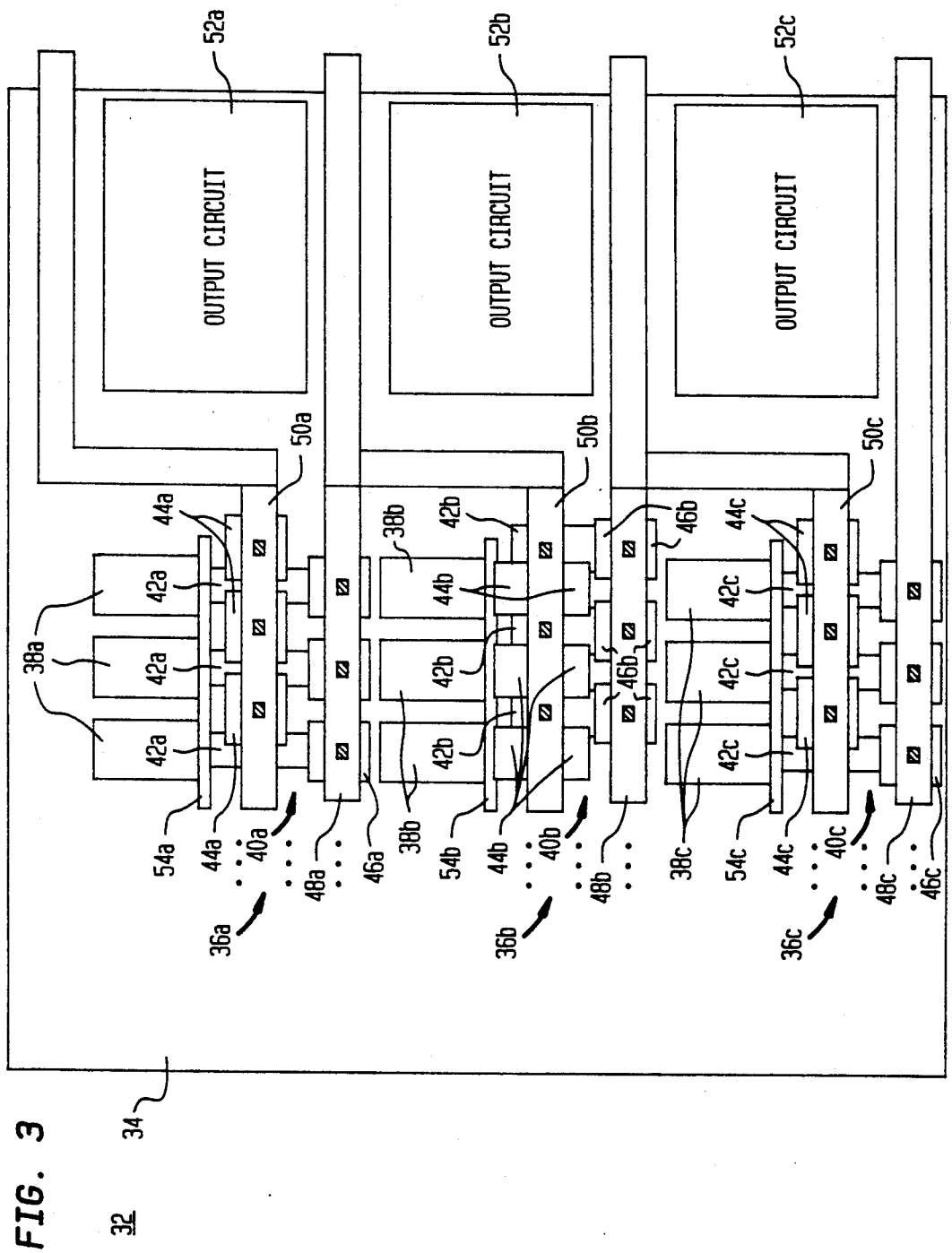
FIG. 3 is a top plan view of a multiple linear CCD sensor array in accordance with the present invention.

Referring now to FIG. 3, there is shown a top plan view of a multiple linear CCD sensor array 32 in accordance with the present invention. Sensor array 32 comprises a substrate body 34 of a semiconductor material which, like the array sensor 30 shown in FIG. 2, comprises first, second and third linear CCD sensors 36a, 36b and 36c therein. The three CCD sensors 36a, 36b and 36c are similar in structure to sensor array 10a, 10b, and 10c of FIG. 2 and are arranged in closely spaced parallel relation with the second CCD sensor 36b being between the first and third CCD sensors 36a and 36c. Each of the CCD sensors 36a, 36b and 36c comprises a plurality of photodetectors 38a, 38b and 38c, respectively, arranged in rows. Although each of the CCD sensors 36a, 36b and 36c is shown as having three photodetectors 38a, 38b and 38c, they include many more of the photodetectors 38a, 38b and 38c to form long CCD sensors 36a, 36b and 36c. The photodetectors 38a, 38b and 38c may be of any well known type of photodetector, such as a photodiode or photocapacitor.

Along each row of the photodetectors 38a, 38b and 38c is a CCD shift register 40a, 40b and 40c respectively. Each of the CCD shift registers 40a, 40b and 40c comprises a channel region (not shown), extending along and parallel to the respective row of photodetectors 38a, 38b and 38c. A layer of an insulating material (not shown), typically silicon dioxide, is on the body 34 and extends over the channel regions.

A first set of gate electrodes 42a, 42b and 42c are on the insulating material layer and extend across the channel region of their respective CCD shift register 40a, 40b and 40c. The gate electrodes 42a, 42b and 42c are spaced along their respective channel region with one of the gate electrodes 42a, 42b and 42c being adjacent a separate one of the photodetectors 38a, 38b and 38c respectively. A second set of gate electrodes 44a, 44b and 44c are on the insulating material layer and extend across the channel region of their respective CCD shift register 40a, 40b and 40c, respectively. The gate electrodes 44a, 44b and 44c are spaced along their respective channel regions with each of the gate electrodes 44a, 44b and 44c being between two of the first set of electrodes 42a, 42b and 42c respectively. Each of the second gate electrodes 44a, 44b and 44c is adjacent a separate one of the photodetectors 38a, 38b and 38c respectively. Thus, there are a pair of gate electrodes adjacent each photodetector 38a, 38b and 38c with the pair including one of each set of gate electrodes 42a, 42b and 42c and 44a, 44b and 44c. The gate electrodes 42a, 42b, 42c, 44a, 44b and 44c are of a conductive material, typically doped polycrystalline silicon. The first set of gate electrodes 42a, 42b and 42c are generally formed of a first level of the polycrystalline silicon, and the second set of gate electrodes 44a, 44b and 44c are generally formed of a second level of the polycrystalline silicon.

The first set of gate electrodes 42a, 42b and 42c have terminal pads 46a, 46b and 46c respectively at their ends opposite the photodetectors 38a, 38b and 38c. A first bus line 48a, 48b and 48c extends across and is electrically connected to the terminal pads 46a, 46b and 46c, respectively. Thus, all the first gate electrodes 42a, 42b and 42c of each CCD shift register 40a, 40b and 40c are electrically connected together. A second bus line 50a, 50b and 50c extends across and is electrically connected to the second set of gate electrodes 46a, 46b and 46c respectively. Thus, all of the second set of gate electrodes 46a, 46b and 46c of each CCD shift register 40a, 40b and 40c, respectively, are electrically connected together. The bus lines 48a, 48b, 48c, 50a, 50b and 50c are of a conductive material, typically a metal, such as aluminum.

At one end of each of the CCD shift registers 40a, 40b and 40c is an area of the body 34 which contains the components of the output circuit 52a, 52b and 52c, respectively, for the shift registers 40a, 40b and 40c. A transfer gate 54a, 54b and 54c extends along each row of the photodetectors 38a, 38b and 38c respectively between the photodetectors 38a, 38b and 38c and the adjacent CCD shift register 40a, 40b and 40c respectively. The transfer gates 54a, 54b and 54c are insulated from the body 34 and are of a conductive material, typically doped polycrystalline silicon.

In the CCD shift registers 40a and 40c of the outer first and third CCD sensors 36a and 36c, the first set of gate electrodes 42a and 42c extend up to their respective transfer gates 54a and 54c, and the second set of gate electrodes 44a and 44c are spaced from the transfer gates 54a and 54c. Thus, when a suitable potential is applied to the transfer gates 54a and 54c, the charge carriers generated and collected in the photodetectors 38a and 38c are transferred to the CCD shift registers 40a and 40c respectively under the first set of gate electrodes 42a and 42c. However, in the CCD shift register 40b of the intermediate CCD sensor 36b, the position of the first and second set of gate electrodes 42b and 44b along the CCD shift register 40b is reversed from the position of the first and second set of gate electrodes 42a, 44a, 42c and 44c of the CCD shift registers 40a and 40c. Thus, in the CCD shift register 40b, the second set of gate electrodes 44b extend up to the transfer gate 54b, and the first set of gate electrodes 42b are spaced from the transfer gate 54b. Therefore, when a suitable potential is applied to the transfer gate 54, charge carriers generated and collected in the photodetectors 38b are transferred to the CCD shift register 40b under the second set of gate electrodes 44b.

The bus lines 48a, 48b, 48c, 50a, 50b and 50c can all extend freely to one end of the CCD sensors 36a, 36b and 36c, the left hand end as shown in FIG. 3. However, at the other end of the CCD sensors 36a, 36b and 36c, the areas 52a, 52b and 52c which contain the output circuits raise a problem. For the first CCD sensor 36a, the second bus line 50a extends around the side of the area 52a away from the second sensor 36b, and the first bus line 48a extends between the output circuits 52a and 52b. For the second CCD sensor 36b, the first bus line 48b extends between the output circuits 52b and 52c, and the second bus line 50b is connected to the first bus line 48a of the first CCD sensor 36a. For the third CCD sensor 36c, the first bus line 48c extends along the side of the area 52c away from the second CCD sensor 36b, and the second bus line 50c is electrically connected to the first bus line 48b of the second CCD sensor 36b. Thus, all of the bus lines 48a, 48b, 48c, 50a, 50b and 50c not only extend to the left hand end of the CCD sensors 36a, 36b and 36c, but they all also extend to the right hand end of the CCD sensors 36a, 36b and 36c around the output circuits 52a, 52b and 52c. This allows all of the CCD sensors 36a, 36b and 36c to be driven from both ends. If the first bus lines 48a and 48c of the CCD sensors 36a and 36c are connected to a first clock phase and the second bus lines 50a and 50c of the CCD sensors 36a and 36c are connected to a second clock phase, the first bus line 48b of the intermediate second CCD sensor 36b is connected to the second clock phase and the second bus line 50b of the intermediate second CCD sensor 36b is connected to the first clock phase. Although this operates the gates electrodes 42b and 44b of the intermediate second CCD shift register 40b opposite that of the gate electrodes 42a, 44a, 42c and 44c of the outer first and third CCD shift registers 40a and 40c, the position of the gate electrodes 42b and 44b along the CCD shift register 40b is reversed with respect to the position of the gate electrodes 42a, 44a, 42c and 44c along the CCD shift registers 40a and 40c, respectively. Thus, the second CCD shift register 40b operates in the same manner as the first and third CCD shift registers 40a and 40c to move the charge carriers therealong. This allows all of the CCD shift registers 40a, 40b and 40c to be operated from both ends, and the overall size of the array 32 is maintained as small as possible.

It is to be appreciated and understood that the specific embodiments of the invention are merely illustrative of the general principles of the invention. Various modifications may be made consistent with the principles set forth. For example, various types of photodetectors can be used and various materials can be used for the gate electrodes and the bus lines.

What is claimed is:

1. An image sensor array comprising:
a body of a semiconductor material;
first, second and third linear CCD sensors on said body, each of the CCD sensors comprising a CCD shift register with first and second sets of gate electrodes, a first bus line electrically connecting the first set of gate electrodes and a second bus line electrically connecting the second set of gate electrodes; and
one of the bus lines of the second CCD sensor being electrically connected to a bus line of the first CCD sensor, and the other bus line of the second CCD sensor being electrically connected to a bus line of the third CCD sensor.

2. The image sensor array of claim 1 in which the three CCD sensors are arranged on the body in parallel relation with the second CCD sensor being between the first and third CCD sensors.

3. The image sensor array of claim 2 further comprising separate output circuits in the body at one common end of each of the CCD sensors, and the bus lines extend between and around the output circuits.

4. The image sensor array of claim 3 in which the bus lines of the first CCD sensor extend along opposite sides of its output circuit, the one bus line of the second CCD sensor is electrically connected to one of the bus lines of the first CCD sensor, the other bus line of the second CCD sensor extends between the output circuit of the second and third CCD sensors, a bus line of the third CCD sensor is electrically connected to the other bus line of the second CCD sensor and the other bus line of the third CCD sensor extends around the output circuit of the third CCD sensor.

5. The image sensor array of claim 4 in which the first bus line of the first CCD sensor extends between the output circuits of the first and second CCD sensors, the second bus line of the second CCD sensor is electrically connected to the first bus line of the first CCD sensor, the first bus line of the second CCD sensor extends between the output circuit of the second and third CCD sensors, and the second bus line of the third CCD sensor is electrically connected to the first bus line of the second CCD sensor.

6. The image sensor array of claim 5 in which each of the CCD sensors further comprises a plurality of photodetectors extending in a line along the CCD shift registers, one gate electrode from each set is adjacent each of the photodetectors and means for transferring charge from the photodetectors to the shift register under the adjacent gate electrode of one of the sets.

7. The image sensor array of claim 6 in which in the first and third CCD sensors, the gate electrodes of the first set extend to the transfer means so that the charges are transferred to the shift register of the first and third CCD sensors under the first set of gate electrodes, and in the second CCD sensor, the second gate electrodes extend to the transfer means so that the charges are transferred to the shift register under the second set of gate electrodes.

8. An image sensor array comprising:
a body of a semiconductor material;
first, second and third rows of photodetectors in spaced parallel relation in the body with the second row being between the first and third rows;
first, second and third CCD shift registers in the body and extending along the first, second and third rows of photodetectors respectively;
each of the CCD shift registers having first and second sets of gate electrodes in alternating relation therealong with one gate electrode of each of the sets being adjacent each photodetectors of its adjacent row of photodetectors;
a separate first bus line connecting the first set of gate electrodes of each CCD shift register; and
a separate second bus line connecting the second gate electrodes of each CCD shift register;
one of the bus lines of the second CCD shift register being connected to a bus line of the first CCD shift register, and the other bus line of the second CCD shift register being connected to a bus line of the third CCD shift register.

9. The image sensor array of claim 8 in which the first bus line of the second CCD shift register is connected to the second bus line of the third CCD shift register, and the second bus line of the second CCD shift register is connected to the first bus line of the first CCD shift register.

10. The image sensor array of claim 9 further comprising:
transfer means between each row of photodetectors and its adjacent CCD shift register for transfer charge from the photodetectors to the CCD shift registers under one set of gate electrodes of the CCD shift registers;
in the first and third CCD shift registers, the gate electrodes of the first set extend to the transfer means so that the charges are transferred to the CCD shift registers under the first set of gate electrodes; and
in the second CCD shift register the second set of gates extend to the transfer means so that the charges are transferred to the second CCD shift register under the second set of gates.

11. The image sensor of claim 10 further comprising first, second and third output circuits in the body at a common end of each of the first, second and third CCD shift registers, and the bus lines extend around the output circuits.

12. The image sensor array of claim 11 in which the first bus line of the first CCD shift register extends between the first and second output circuits, and the first bus line of the second CCD shift register extends between the second and third output circuits.

13. The image sensor array of claim 12 in which the second bus line of the first CCD shift register extends around the side of the first output circuit away from the second output circuit, and the first bus line of the third CCD shift register extends around the side of the third output circuit away from the second output circuit.

* * * * *